(12) United States Patent
Yoshihara

(10) Patent No.: US 7,300,810 B2
(45) Date of Patent: Nov. 27, 2007

(54) SOLID-STATE IMAGING DEVICE AND METHOD OF MANUFACTURING THE SAME

(75) Inventor: Ikuo Yoshihara, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/560,455

(22) Filed: Nov. 16, 2006

(65) Prior Publication Data

US 2007/0092985 A1    Apr. 26, 2007

Related U.S. Application Data

(62) Division of application No. 11/137,635, filed on May 25, 2005, now Pat. No. 7,187,023.

(30) Foreign Application Priority Data

May 31, 2004    (JP)    ............................ P2004-162035

(51) Int. Cl.
*H01L 21/00*    (2006.01)
(52) U.S. Cl. ............................ 438/24; 438/42; 438/48; 438/69
(58) Field of Classification Search ............ 438/22–29, 438/42–48, 69–72
See application file for complete search history.

(56) References Cited

U.S. PATENT DOCUMENTS

| 7,101,726 B2* | 9/2006 | Yamamoto et al. ............ 438/69 |
| 2006/0011952 A1* | 1/2006 | Ohkawa ...................... 438/48 |

* cited by examiner

*Primary Examiner*—Cuong Nguyen
(74) *Attorney, Agent, or Firm*—Sonnenschein Nath & Rosenthal LLP

(57) ABSTRACT

A solid-state imaging device is provided in which noise to an image signal is restrained and miniaturization is facilitated in a peripheral circuit formation region.

A solid-state imaging device includes a pixel formation region 4 and a peripheral circuit formation region 20 formed in the same semiconductor substrate; in the peripheral circuit formation region 20 a first element isolation portion is formed of an element isolation layer 21 in which an insulation layer is buried in a semiconductor substrate 10; in the pixel formation region 4 a second element isolation portion made of an element isolation region 11 formed inside the semiconductor substrate 10 and an element isolation layer 12 projecting upward from the semiconductor substrate 10 is formed; and a photoelectric conversion element 16 (14, 15) is formed extending to a position under the element isolation layer 12 of the second element isolation portion.

2 Claims, 14 Drawing Sheets

US 7,300,810 B2

SOLID-STATE IMAGING DEVICE AND METHOD OF MANUFACTURING THE SAME

RELATED APPLICATION DATA

This application is a divisional of U.S. patent application Ser. No. 11/137,635, filed May 25, 2005 now U.S. Pat. No. 7,187,023, the entirety of which is incorporated herein by reference to the extent permitted by law. The present application claims priority to Japanese patent application No. 2004-162035 filed in the Japanese Patent Office on May 31, 2004, the entirety of which also is incorporated by reference herein to the extent permitted by law.

BACKGROUND OF THE INVENTION

1. Field of the Invention

The present invention relates to a solid-state imaging device (image sensor) used for a video camera, a digital still camera and the like, and a method of manufacturing the solid state imaging device.

2. Description of the Related Art

A solid-state imaging device (image sensor) is a semiconductor device including a plurality of pixels that are photoelectric converters and a MOS transistor that selectively reads out a signal of the pixel to read out a signal of a pixel and is used for a video camera, a digital still camera and the like, for example.

Among solid-state imaging devices, particularly what is called a CMOS-type solid-state imaging device (CMOS image sensor) manufactured in a CMOS (complementary type MOS) process has advantages of low voltage and low power consumption, multifunction, and an SOC (system on chip) in which a peripheral circuit is integrated to be a single chip.

Accordingly, a CMOS-type solid-state imaging device has attracted attention as an imaging device used in a camera for a mobile phone unit, a digital still camera and a digital video camera.

FIG. 1 is a schematic constitutional diagram (circuit configuration diagram) showing an example of a structure of a CMOS-type solid-state imaging device (CMOS image sensor).

The CMOS image sensor shown in FIG. 1 includes on the same semiconductor substrate a pixel formation region 4 in which pixels 1 each of which is made of a plurality of photodiodes 2 performing photoelectric conversion and a MOS transistor 3 selectively reading out from the photodiode 2 are arranged two-dimensionally, and peripheral circuits 5 and 6 to select a pixel and to output a signal.

Hereinafter, a region other than the pixel formation region 4, specifically a region including the pixel selecting circuit 5 and the output circuit 6 is called "peripheral circuit formation region".

In the pixel formation region 4, each pixel 1 includes the photodiode 2 and three MOS transistors that are a transfer transistor 3, a reset transistor 7 and an amplifier transistor 8. In addition, in the peripheral circuit formation region, CMOS transistors are used to form the pixel selecting circuit 5 and the output circuit 6.

In a CMOS image sensor in related art, each circuit in a peripheral circuit formation region is formed of a CMOS transistor.

On the other hand, all of MOS transistors constituting each pixel in a pixel formation region are NMOS transistors.

The NMOS transistor constituting a pixel is made to have the same element isolation structure as an NMOS transistor normally used in a peripheral circuit formation region (for example, refer to Patent Reference 1).

FIG. 2 is a sectional view showing an element isolation structure used for a peripheral circuit formation region in a CMOS image sensor of related art.

An N-type semiconductor well region 52 and a P-type semiconductor well region 53 are formed in a semiconductor substrate 51. A PMOS transistor 54 is formed in the N-type semiconductor well region 52 and an NMOS transistor 55 is formed in the P-type semiconductor well region 53, respectively.

Further, these transistors 54 and 55 are electrically separated from each other by an element isolation portion 56 made of what is called STI (Shallow Trench Isolation) in which an element isolation layer is buried in a trench formed in the semiconductor substrate 51. In this element isolation portion 56, an oxide film is buried as the element isolation layer, for example.

Furthermore, in the CMOS image sensor of related art, since the NMOS transistor constituting a pixel is separated by the element isolation portion 56 having the same structure as the NMOS transistor used in the peripheral circuit formation region, the element isolation portion 56 in which the element isolation layer is buried in the semiconductor substrate 51 shown in FIG. 2 is similarly formed, so that adjacent pixel cells 1 are also separated in the pixel formation region 4 of FIG. 1.

In addition, source/drain diffusion layers of transistors such as the transfer transistor 3, the amplifier transistor 8, the reset transistor 7 and the like, for example, formed in each pixel cell 1 of the pixel formation region 4 are also separated by the element isolation portions 56 of a similar structure, respectively.

[Patent Reference 1] Published Japanese Patent Application No. 2003-142674 (FIG. 9)

However, in the CMOS sensor of related art, since the element isolation portion 56 is formed by burying the element isolation layer in the trench formed in the semiconductor substrate 51 as described above, there is such a case that a warp and a crystalline defect occur in the semiconductor substrate 51 due to a damage caused when forming the trench in the semiconductor substrate 51 and further due to a stress and the like caused by a difference in thermal expansion coefficient between the semiconductor substrate 51 and the buried insulation layer (element isolation layer) 56 in a heat treatment process during manufacturing.

An unnecessary electric charge (such as leakage current and dark current) is generated by the warp and crystalline defect and enters the photodiode 2.

Since the electric charge accumulated in the photodiode 2 is transferred through the transfer transistor 3, the electric charge generated by the warp and the crystal defect directly becomes a noise signal to a pixel signal.

Furthermore, when a trench is formed in a monocrystalline substrate such as a silicon substrate, a monocrystalline end portion is formed not only on the surface of the substrate but also on a sidewall of the trench and thereby an interfacial level formed in the end portion also becomes a factor of a noise signal to an image signal.

In addition, in the past, an NMOS transistor constituting a pixel has been separated by an element isolation portion 56 having the same structure as an NMOS transistor used in a peripheral circuit formation region; on the contrary, with respect to a CMOS transistor used in the peripheral circuit formation region, usually the most advanced process of miniaturization technology is applied, and further a power supply voltage is made low in terms of higher-speed operation, low power consumption, and space saving in design.

Hence, when the element isolation portion 56 is optimized corresponding to the design of the CMOS transistor in the peripheral circuit formation region, there may occur such a case that the above-described unnecessary electric charge is likely to be generated in the element isolation portion 56 in the pixel formation region 4.

The present invention addresses the above-identified, and other problems associated with conventional methods and apparatuses and provides a solid-state imaging device in which a noise to an image signal can be restrained and miniaturization can be facilitated in a peripheral circuit formation region, and a method of manufacturing the same.

SUMMARY OF THE INVENTION

A solid-state imaging device according to an embodiment of the present invention includes in the same semiconductor substrate a pixel formation region having a pixel made of a photoelectric conversion element and a selection transistor to read out a signal charge from the photoelectric conversion element and a peripheral circuit formation region, in which a first element isolation portion formed of an element isolation layer made of an insulation layer buried in the semiconductor substrate is formed in the peripheral circuit formation region and a second element isolation portion formed of an element isolation region made inside the semiconductor substrate and an element isolation layer projecting upward from the semiconductor substrate is formed in the pixel formation region, and the photoelectric conversion element is formed extending to a position under the element isolation layer of the second element isolation portion.

A method of manufacturing a solid-state imaging device according to an embodiment of the present invention in which a pixel formation region includes a pixel made of a photoelectric conversion element and a selection transistor to read out a signal charge from the photoelectric conversion element and a peripheral circuit formation region formed in the same semiconductor substrate, including the steps of: forming a stopper layer on the semiconductor substrate; forming a trench reaching from the stopper layer to the inside of the semiconductor substrate in a portion that becomes the peripheral circuit formation region; burying an insulation layer inside the trench to be planarized; forming an opening shallower than the trench from the stopper layer in a portion that becomes the pixel formation region; and burying the insulation layer inside the opening to be planarized.

BRIEF DESCRIPTION OF THE DRAWINGS

FIGS. 5A and 5B are characteristic curves of the solid-state imaging device in FIG. 3, in which FIG. 5A shows a relation between a depth of an element isolation layer inside the substrate and the number of pixels of abnormal output and FIG. 5B shows relations between a thickness of the element isolation layer, and element isolation ability and the number of occurrences of gate short-circuit;

FIGS. 14A and 14B are characteristic curves of the solid-state imaging device in FIG. 10, in which FIG. 14A shows a relation between a depth of an element isolation layer inside the a substrate and the number of pixels of abnormal output and FIG. 14B shows relations between a thickness of the element isolation layer, and element isolation ability and the number of occurrences of gate short-circuit.

DESCRIPTION OF THE PREFERRED EMBODIMENTS

Figure 3:
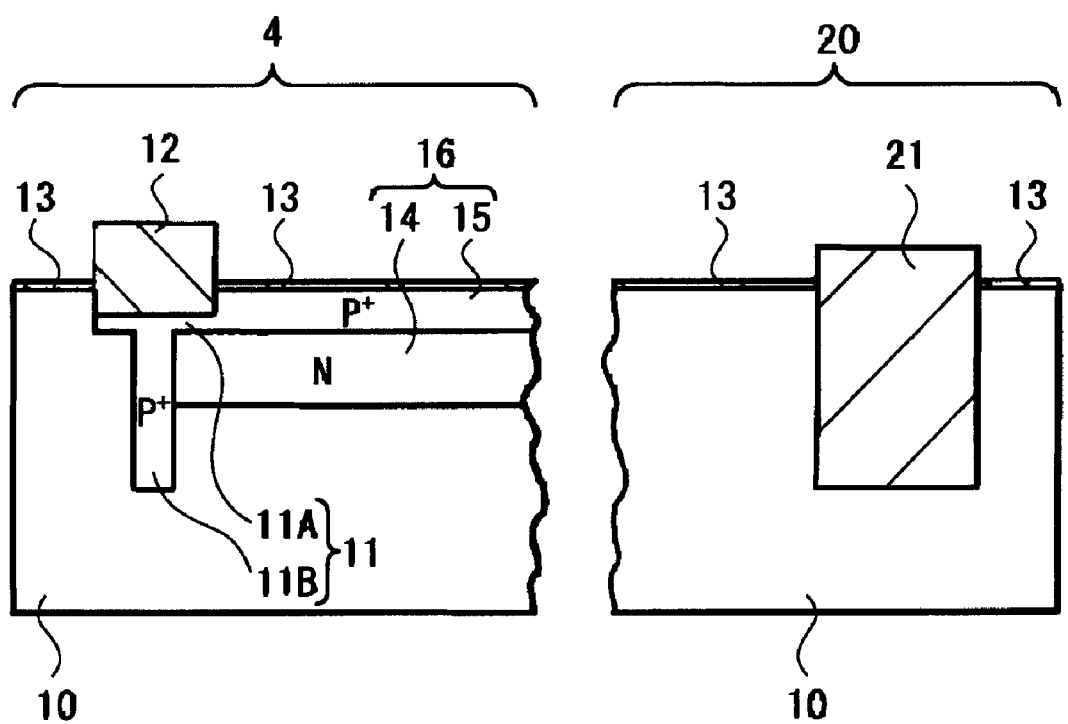
FIG. 3 is a schematic constitutional view (sectional view) of a solid-state imaging device according to an embodiment of the present invention.

FIG. 3 shows a schematic constitutional view (sectional view) of a solid-state imaging device according to an embodiment of the present invention.

Figure 1:
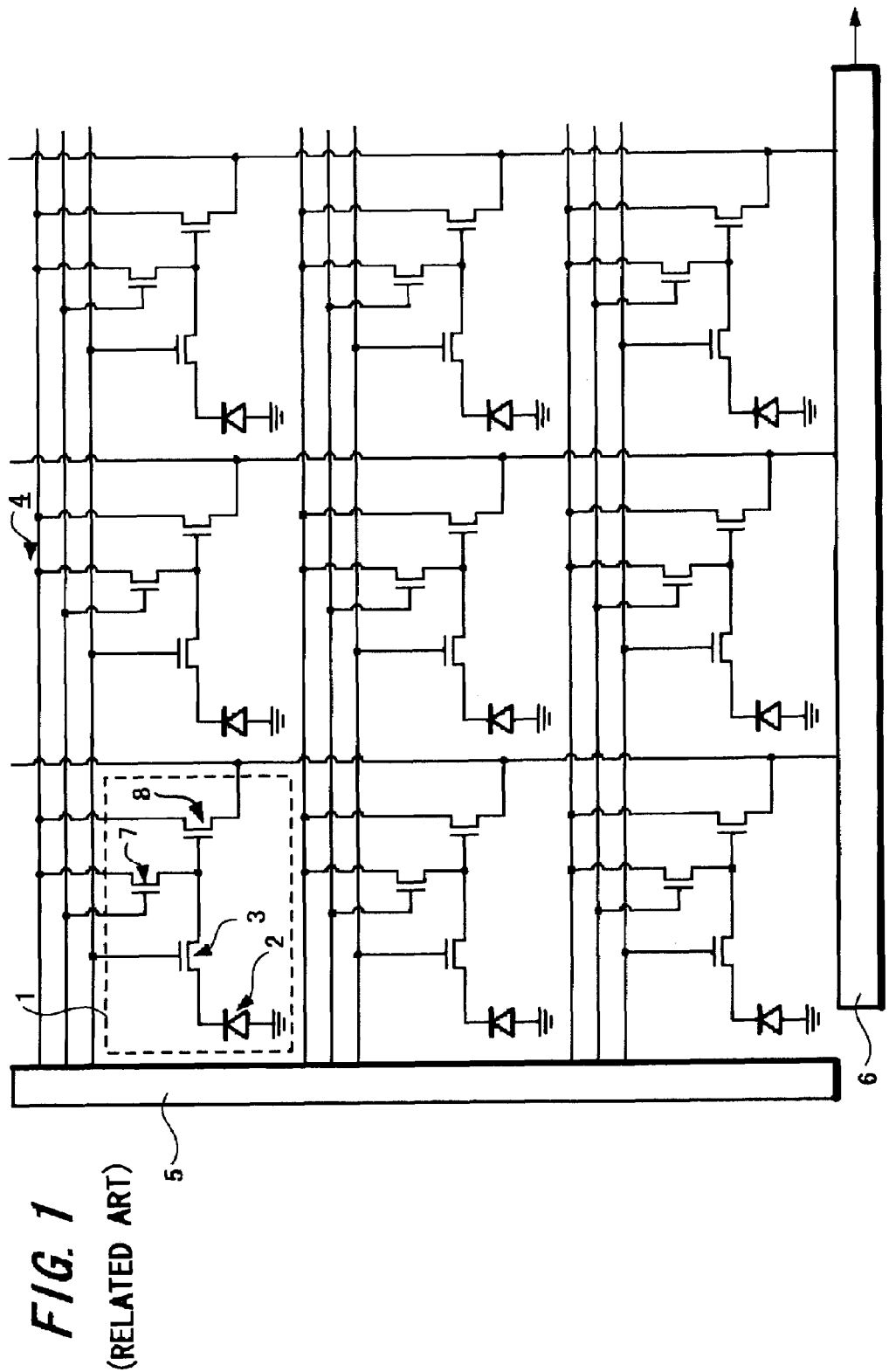
FIG. 1 is a circuit configuration diagram of a solid-state imaging device in related art.
Figure 4:
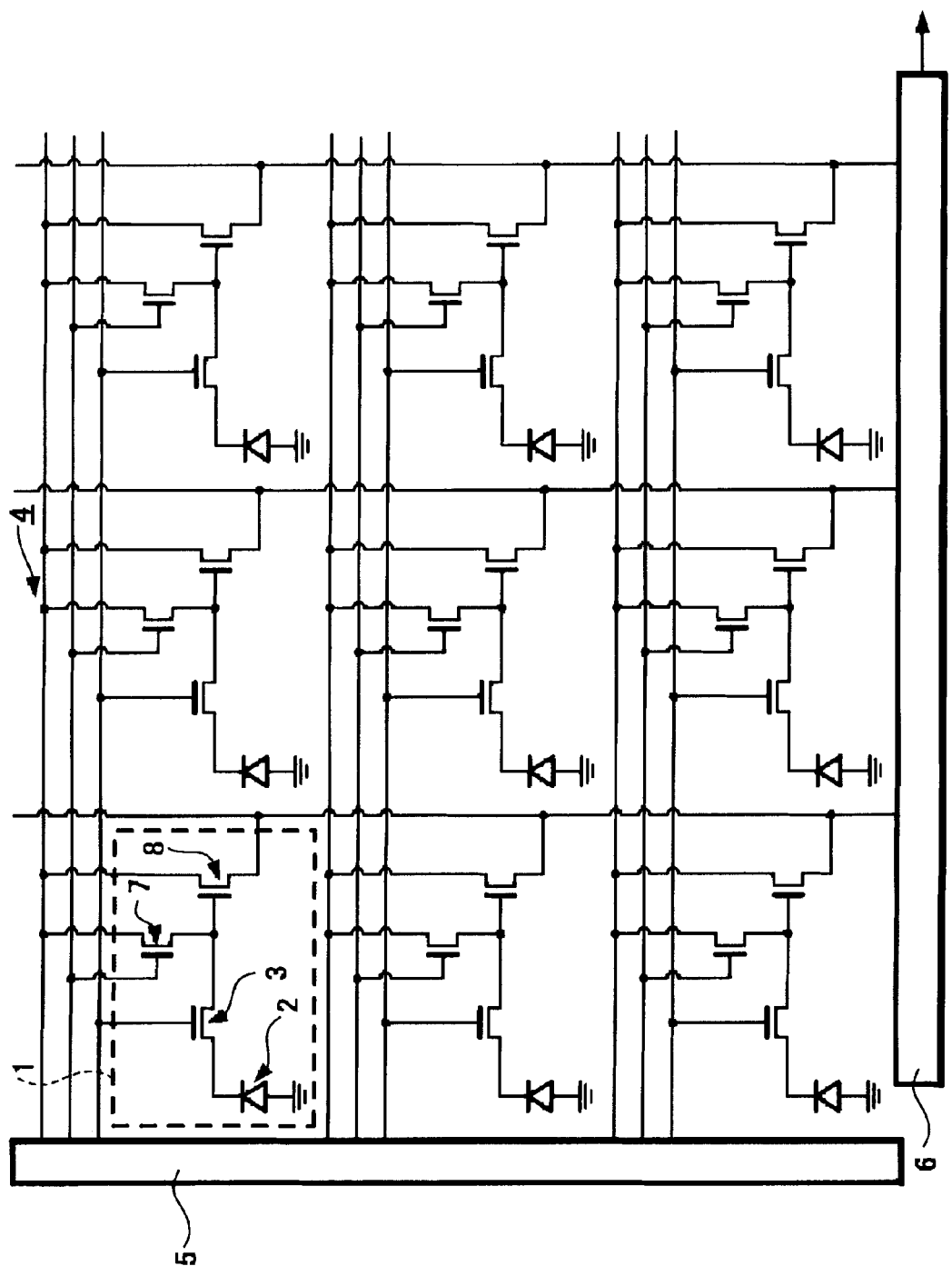
FIG. 4 is a circuit configuration diagram of the solid-state imaging device of FIG. 3.

Further, FIG. 4 shows a circuit configuration diagram of the solid-state imaging device according to the embodiment. The solid-state imaging device according to this embodiment has a similar circuit configuration to the circuit configuration previously shown in FIG. 1.

This solid-state imaging device includes a pixel formation region 4 where a large number of pixel cells 1 each having a photodiode 2 are formed and a peripheral circuit formation region 20 formed in the same semiconductor substrate 10 made of, for example, a N-type silicon substrate.

Figure 2:
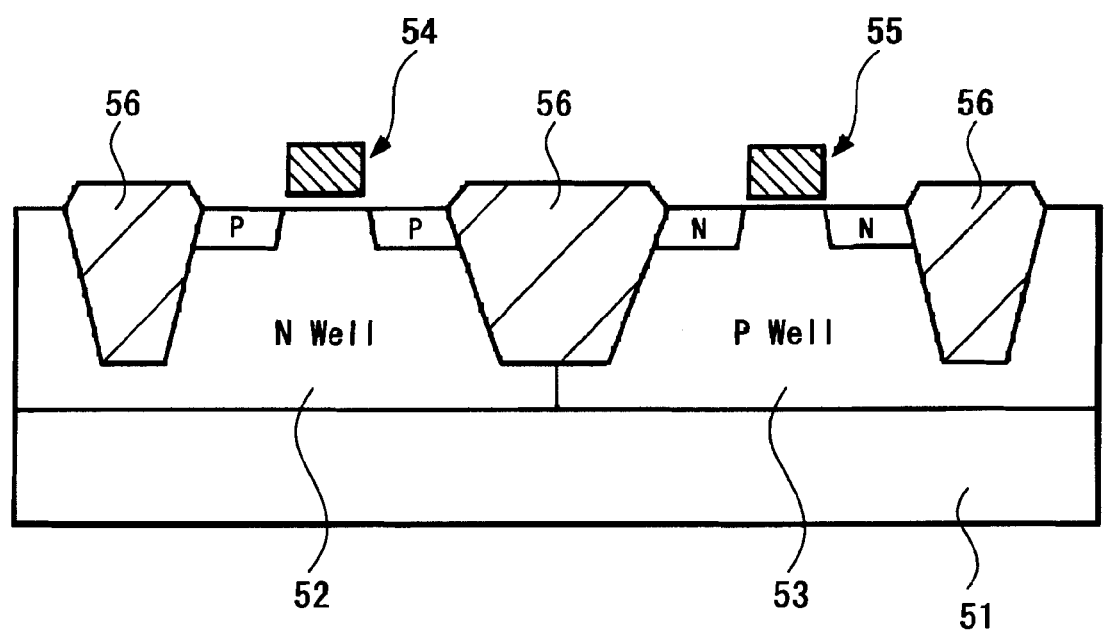
FIG. 2 is a sectional view of a peripheral circuit formation region of a CMOS sensor in related art.

Similarly to the configuration of the element isolation portion 56 in the related art shown in FIG. 2, an element isolation portion in which an element isolation layer 21 of a silicon oxide film or the like is buried in the semiconductor substrate 10 is formed in the peripheral circuit formation region 20 as shown in FIG. 3. Specifically, this element isolation portion has what is called a trench element isolation (STI: Shallow Trench Isolation) structure. Reference numeral 13 in the drawing denotes a thin surface insulation film (for example, a silicon oxide film) of the substrate 10.

In the pixel formation region 4, a sensor portion 16 is made including a charge accumulation region 14 of N-type formed in the semiconductor substrate 10 and a positive charge accumulation region 15 of P-type ($P^+$) formed around the surface of the semiconductor substrate 10.

Although not shown in the drawing, source/drain regions of a transistor are formed in each of the pixel formation region 4 and the peripheral circuit formation region 20 in the semiconductor substrate 10, and a gate electrode or the like of a transistor is formed on the semiconductor substrate 10 through the insulation film 13. In addition, in the pixel formation region 4, a color filter and an on-chip lens are further formed above according to necessity.

As shown in FIG. 4, the circuit of this CMOS image sensor is configured to include on the same semiconductor substrate the pixel formation region 4 in which the pixels 1 each made of a plurality of photodiodes 2 to perform photoelectric conversion and a MOS transistor 3 to selectively read out from the photodiode 2 are arranged two-dimensionally, and peripheral circuits 5 and 6 for pixel selection and for signal output.

In the pixel formation region 4, each pixel 1 includes the photodiode 2 and three MOS transistors that are a transfer transistor 3, a reset transistor 7 and an amplifier transistor 8. Further, the pixel selection circuit 5 and the output circuit 6 are formed using a CMOS transistor in the peripheral circuit formation region.

In the solid-state imaging device according to this embodiment, particularly in the pixel formation region 4, the configuration of the element isolation portion respectively separating the transistors 3, 7 and 8 between pixel cells 1 and within each pixel cell 1 (refer to the circuit configuration diagram of FIG. 4) differs from the element isolation portion of the peripheral circuit formation region 20.

Specifically, as shown in the pixel formation region 4 in the sectional diagram of FIG. 3, an element isolation layer 11 made of an impurity diffusion layer of P-type ($P^+$) is made inside the semiconductor substrate 10 and a convex-shaped element isolation layer (cover layer) 12 projecting from the semiconductor substrate 10 is made above the P-type element isolation region 11, and the element isolation portion is formed of these element isolation region 11 and element isolation layer (cover layer) 12.

This convex-shaped element isolation layer (cover layer) 12 can be formed of an insulation layer such as a silicon oxide film, for example.

The P-type element isolation region 11 has an upper wide portion 11A and a lower narrow portion 11B and has approximately T-shaped section.

Since the P-type element isolation region 11 is formed as described above, element isolation can be performed based on the junction separation.

In addition, since the element isolation layer (cover layer) 12 is formed, leakage current due to the parasitic MOS can be restrained.

Further, in the solid-state imaging device according to this embodiment, the P-type positive charge accumulation region 15 on the surface of the sensor portion 16 is formed to connect to the upper portion 11A of the element isolation region 11, and the N-type charge accumulation region 14 of the sensor portion 16 extends to a position under the element isolation layer (cover layer) 12 to be formed contacting with the lower portion 11B of the element isolation region 11.

In a structure of related art in which the STI is adopted in an element isolation portion of a pixel formation region, a P-type region has been formed around an insulation layer of STI structure for the purpose of noise reduction as described in the above-mentioned patent reference 1, for example. Since the P-type region is thus formed, it has been difficult to form a N-type charge accumulation region of a sensor portion widely.

On the contrary, according to this embodiment, since the element isolation is performed in the pixel formation region 4 by means of the element isolation region 11 instead of the element isolation by the STI, the width of the element isolation portion in the semiconductor substrate 10 can be made narrower than the STI, and thereby the N-type charge accumulation region 14 of the sensor portion 16 can be formed widely such that this charge accumulation region is formed extending to a position under the element isolation layer (cover layer) 12.

A saturation charge quantity Qs can be increased by thus forming the charge accumulation region extending to a position under the element isolation layer (cover layer) 12.

With respect to the element isolation layer (cover layer) 12 of the pixel formation region 4, it is desirable that the depth inside the semiconductor substrate 10 is made to 50 nm or less and the thickness is made within a range from 50 nm to 150 nm.

In addition, although the element isolation layer (cover layer) 12 is formed partially entering the semiconductor substrate 10 as shown in FIG. 3, the element isolation layer (cover layer) 12 may be formed only on the surface of the semiconductor substrate 10.

Figure 5A:
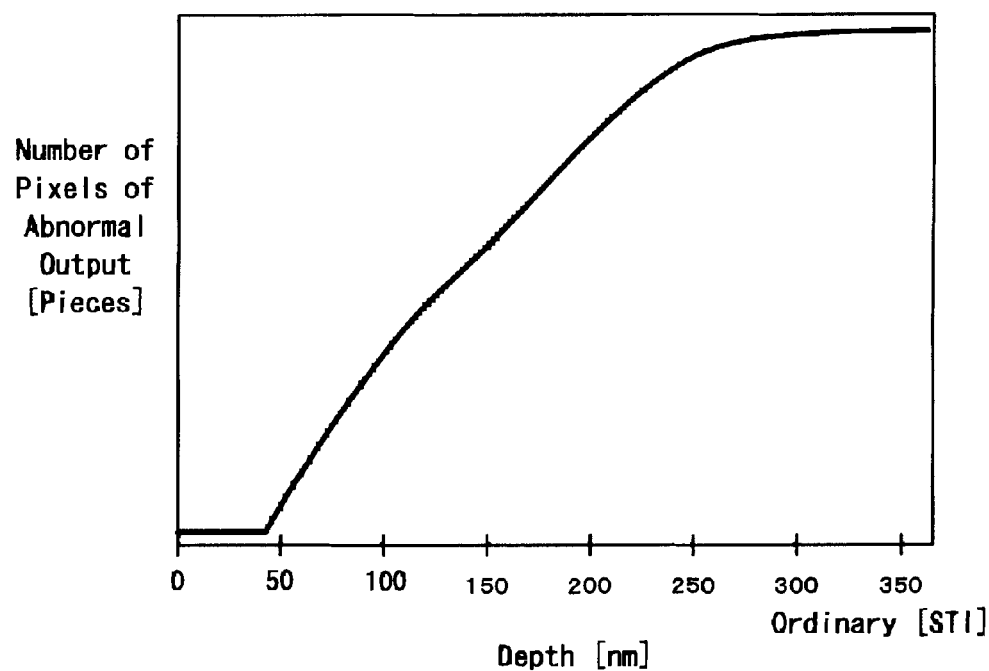

FIG. 5A shows a relation in the pixel formation region 4 between the depth formed inside the semiconductor substrate 10 of the element isolation layer (cover layer) 12 made of the silicon oxide film (amount of digging into the silicon substrate 10) and the number of pixels in which abnormal output (noise) is generated.

As shown in FIG. 5A, when the depth exceeds 50 nm, the number of pixels in which abnormal output is generated increases. This indicates the fact that a stress caused by a difference in thermal expansion coefficient generated between the buried element isolation layer (silicon oxide film) 12 and the silicon substrate 10 reaches a level that can not be neglected. In addition, this also means that when the depth is further increased, the interfacial level of the silicon substrate 10 increases and an uncontrollable trap charge increases.

Note that "ordinary STI" shown in the drawing indicates 350 nm that is a thickness of an element isolation layer of ordinary STI structure. It is understood that the number of pixels in which abnormal output is generated can be greatly decreased according to the structure of this embodiment in comparison with the element isolation layer of ordinary STI structure.

Figure 5B:
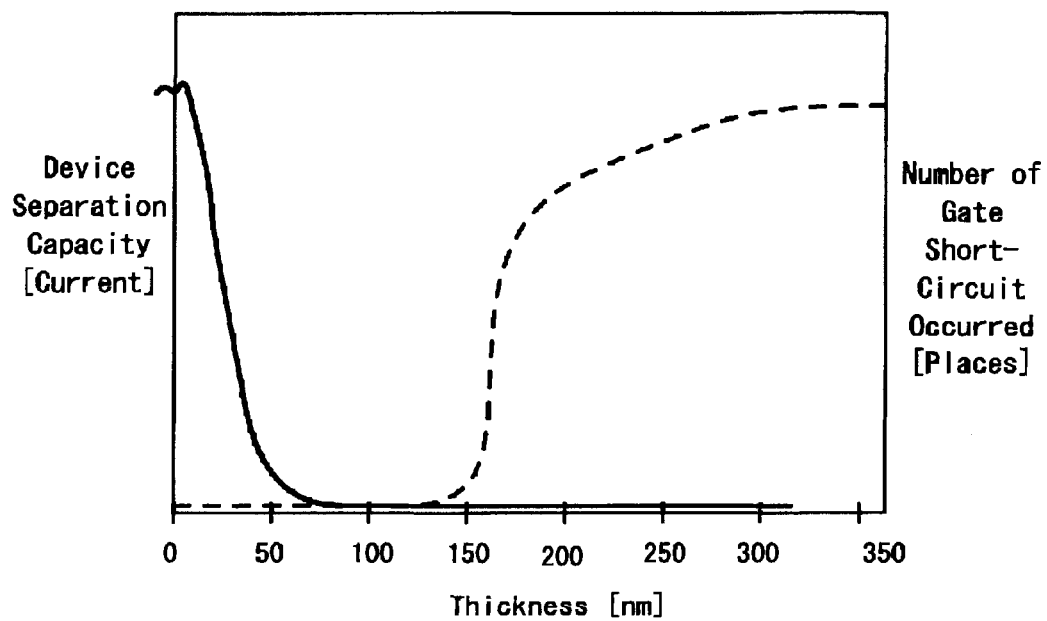

Further, FIG. 5B shows a relation between the thickness of the element isolation layer (silicon oxide film) 12 of the pixel formation region 4, and element isolation capacity (critical value of leakage current) and the number of occurrences of gate short-circuit. A solid line shows the element isolation capacity, and a broken line shows the number of occurrences of gate short-circuit.

As shown in FIG. 5B, when the thickness of the element isolation layer 12 becomes less than 50 nm, the leakage current of the parasitic MOS transistor indicating the element isolation capacity increases; and on the other hand, when the thickness exceeds 150 nm, the gate electrode tends to become short-circuited and a yield ratio deteriorates considerably. This is due to the fact that the process to form the gate electrode on the element isolation layer 12 becomes difficult and the number of occurrences of gate short-circuit increases when the element isolation layer 12 is thickened.

Accordingly, with respect to the element isolation layer (cover layer) 12 formed in the pixel formation region 4, it is desirable that the depth inside the semiconductor substrate 10 is 50 nm or less, and the thickness is within the range of 50 nm to 150 nm.

Further, it is preferable that the minimum separation width of the element isolation portion of the peripheral circuit formation region 20 is less than the minimum separation width of the element isolation portion of the pixel formation region 4.

With such structure, since the minimum separation width of the element isolation portion is small in the peripheral circuit formation region 20, miniaturization of the solid-state imaging device can further be achieved and higher-speed operation, low power consumption and space saving can be obtained. Further, since the minimum separation width of the element isolation portion is large in the pixel formation region 4, the generation of noise and leakage current can be restrained sufficiently.

The solid-state imaging device according to this embodiment can be manufactured, for example, as follows.

First, a surface of the semiconductor substrate 10 that is a silicon substrate, for example, is oxidized to form a silicon oxide film 31. A thickness of this silicon oxide film 31 is from 5 nm to 20 nm, for example.

Figure 6A:
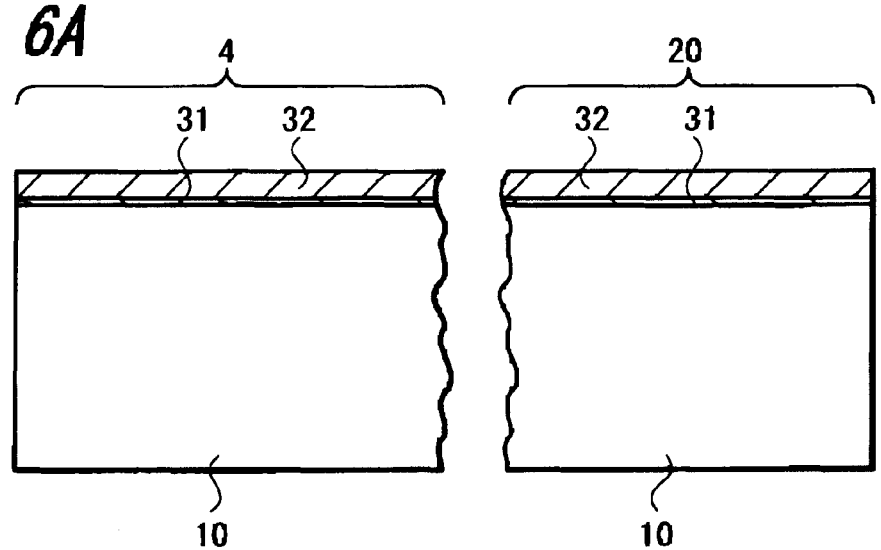
FIGS. 6A through 6C are process diagrams showing a method of manufacturing the solid-state imaging device of FIG. 3.

Next, a silicon nitride film 32 having a film thickness of 100 nm to 200 nm, for example, is formed on the silicon oxide film 31 by a CVD (Chemical Vapor Deposition) method (so far refer to FIG. 6A). It should be noted that this silicon nitride film 32 becomes a polishing stopper in a process of polishing a silicon oxide film, which is formed later on, by a CMP (Chemical Mechanical Polishing) method.

Figure 6B:
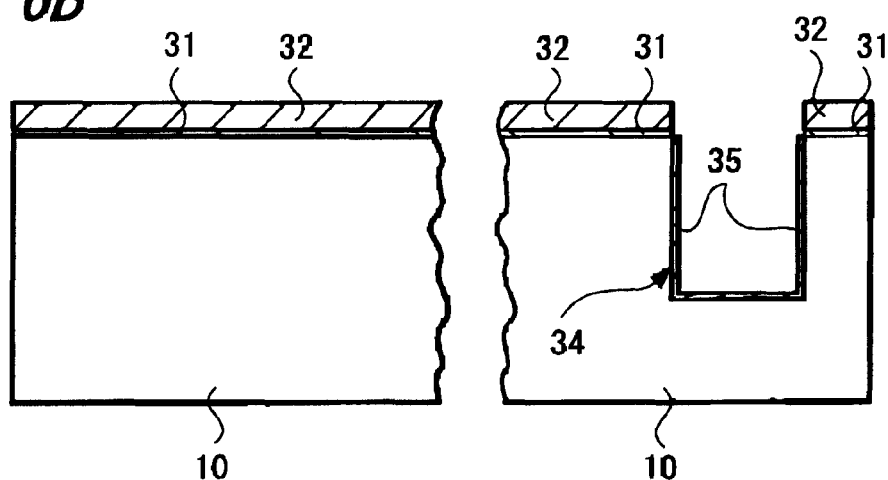

Next, after the silicon nitride film 32, the silicon oxide film 31 and the silicon substrate 10 are etched by an ordinary method in the peripheral circuit formation region 20 to form a trench 34 in the silicon substrate 10, a surface of the trench 34 is oxidized to form an oxide film 35 (so far refer to FIG. 6B). A thickness of this oxide film 35 is from 5 nm to 20 nm, for example.

Further, a silicon oxide film 36 is formed by a HDP (High Density Plasma) method. Thus, the trench 34 is filled to form the silicon oxide film 36.

Figure 6C:
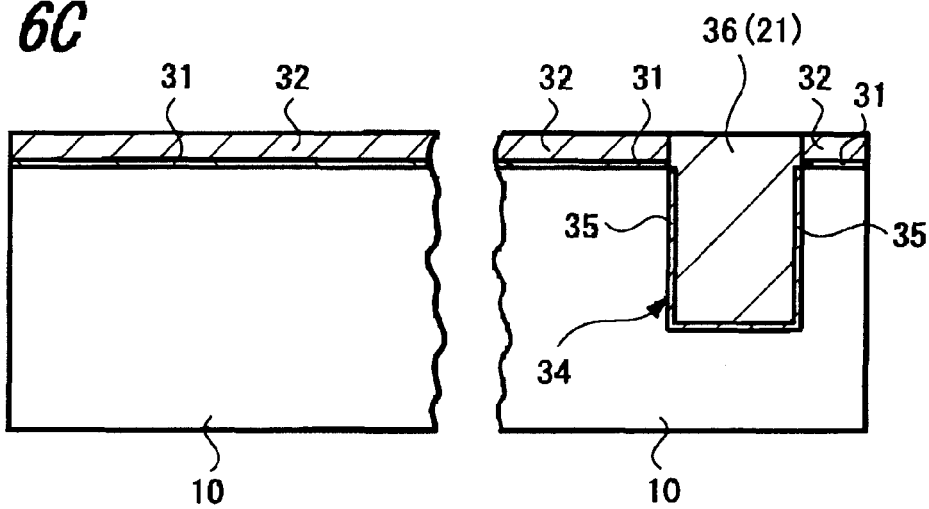

Subsequently, the surface is planarized by the CMP method or the like, so that the silicon oxide film 36 remains only in the trench 34. Accordingly, an element isolation layer 21 made of the silicon oxide film 36 is formed in the peripheral circuit formation region 20 (so far refer to FIG. 6C). Note that since the element isolation layer 21 in FIG. 3 includes the silicon oxide film 35 on the inner wall of the trench 34, in the following drawings the silicon oxide film 35 and the silicon oxide film 36 is combined to be the element isolation portion 21.

Figure 7A:
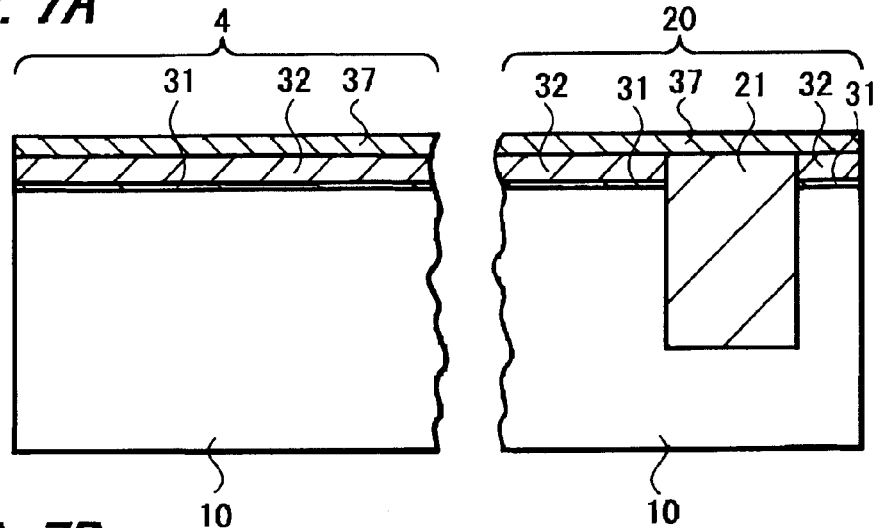
FIGS. 7A through 7C are process diagrams showing a method of manufacturing the solid-state imaging device of FIG. 3.

Next, as shown in FIG. 7A, a silicon nitride film 37 having the thickness of 30 nm to 150 nm, for example, is formed on the surface.

Here, it is desirable that pretreatment using fluoric acid is performed to remove the silicon oxide film 36 remaining other than the inside of the trench 34 before forming the silicon nitride film 37 in consideration of removing a laminated film of the silicon nitride films 32 and 37 using hot phosphoric acid liquid in a later process after the element isolation portion (11, 12) of the pixel formation region 4 is formed.

Figure 7B:
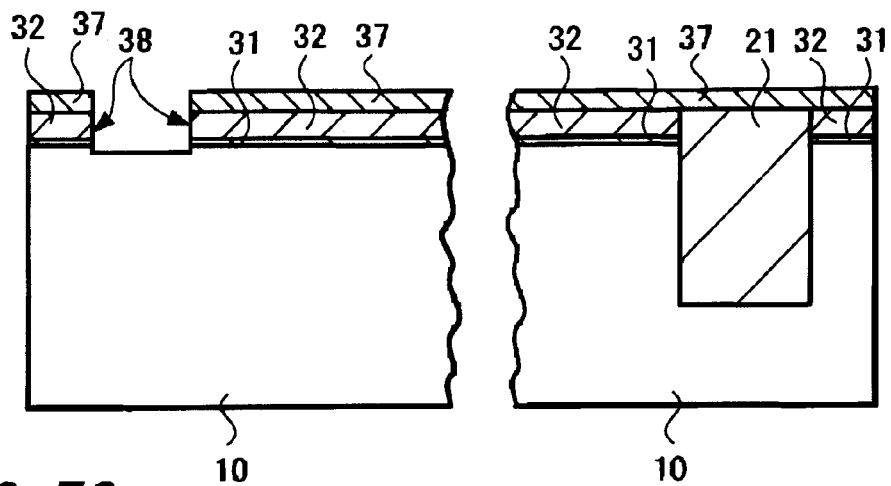

Next, as shown in FIG. 7B, an opening 38 is formed in the laminated film of the silicon nitride films 32 and 37 at a portion corresponding to the element isolation portion of the pixel formation region 4.

It is desirable that an amount of digging into the silicon substrate 10 is made as small as possible when forming the opening 38, and the depth thereof is controlled to be 50 nm or less.

Subsequently, the surface of the silicon substrate 10 exposed by the opening 38 is oxidized to form a silicon oxide film 39 having a thickness of 5 nm to 20 nm.

Figure 7C:
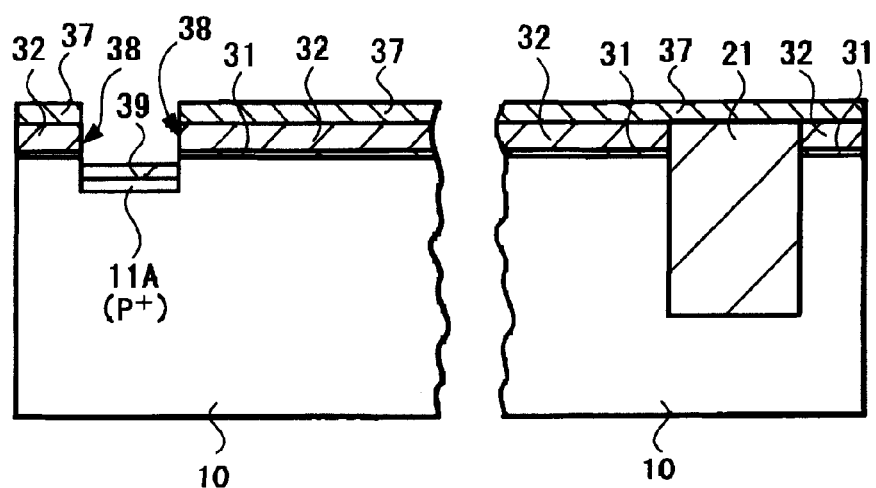

Further, an upper portion 11A of an element isolation region (channel stop layer) 11 is formed by ion implantation of a P-type impurity such as boron, for example, in a concentration of $1\times10^{12}$ to $5\times10^{13}$ piece/cm$^2$ (so far refer to FIG. 7C).

Next, a silicon oxide film 41 is formed to cover a surface by the CVD method. The silicon oxide film 41 is formed thinner than the laminated film of the silicon nitride films 32 and 37. Hence, the silicon oxide film 41 is formed along the inner wall of the opening 38, and space remains in a central part of the opening 38.

Figure 8A:
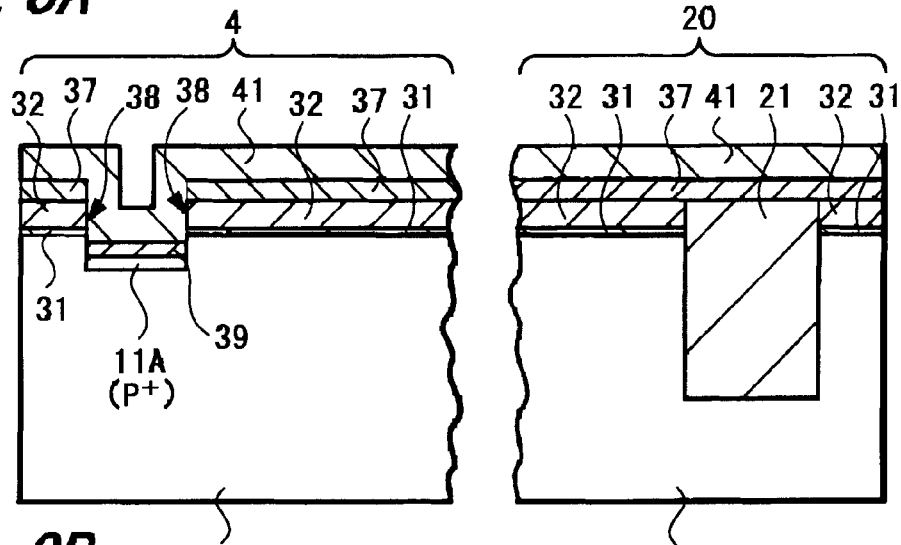
FIGS. 8A through 8C are process diagrams showing a method of manufacturing the solid-state imaging device of FIG. 3.

It is desirable that the silicon oxide film 41 is an HTO (High Temperature Oxide) (so far refer to FIG. 8A).

Figure 8B:
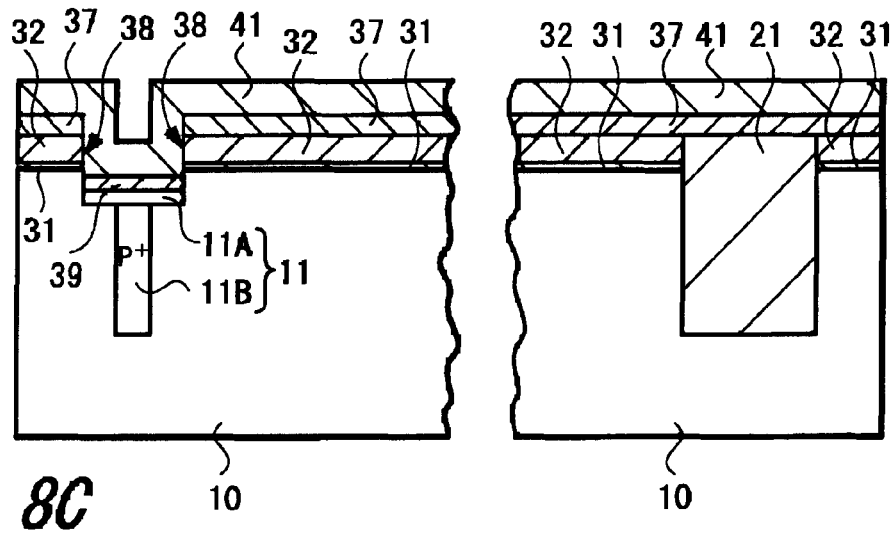

Next, a resist mask (not shown) is formed, and a lower portion 11B of the element isolation region 11 is formed using this resist mask by ion implantation of a P-type impurity such as boron, for example, in a concentration of $5\times10^{12}$ to $1\times10^{14}$ piece/cm$^2$ into the silicon substrate 10. Here, the silicon oxide film 41 inside the opening 38 acts as a mask when the ion implantation is performed, and the width of the lower portion 11B of the element isolation region 11 becomes narrow corresponding to the space in the central part of the opening 38. Accordingly, the lower portion 11B of the element isolation region 11 is formed to have a narrower width than the upper portion 11A, and the element isolation region 11 is formed to have a T-shaped section (so far refer to FIG. 8B).

Next, a silicon oxide film 42 having a thickness of 100 nm to 200 nm, for example, is formed by the HDP method. Hence, the space in the central part of the opening 38 is filled with the silicon oxide film 42.

Figure 8C:
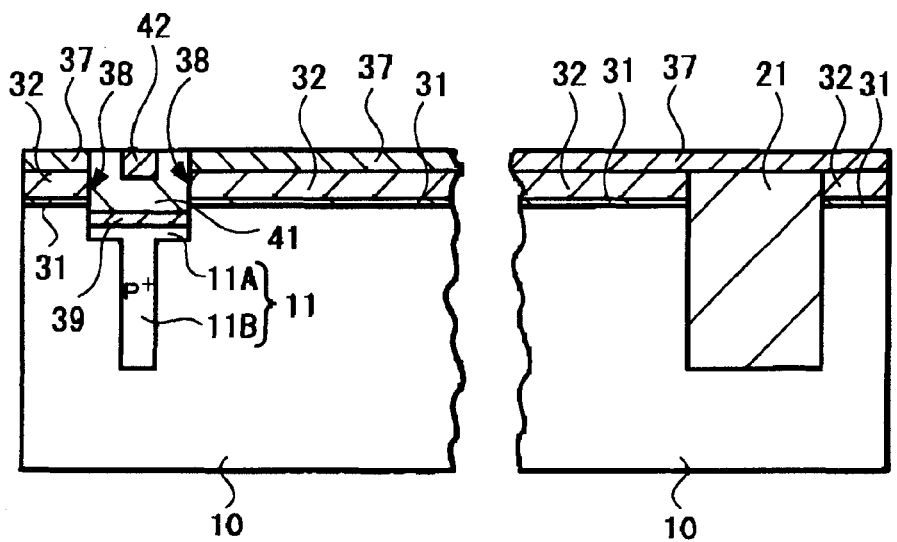

Subsequently, the silicon oxide film 42 above the silicon nitride film 37 is removed by planarizing the surface using the CMP (Chemical Mechanical Polishing) method or an etch-back method. At this time, the silicon nitride film 37 acts as a stopper layer for the CMP or the etching. Accordingly, only the silicon oxide film 42 inside the opening 38 remains (so far refer to FIG. 8C).

Next, the silicon nitride films 37 and 32 are removed using the hot phosphoric acid liquid.

Figure 9A:
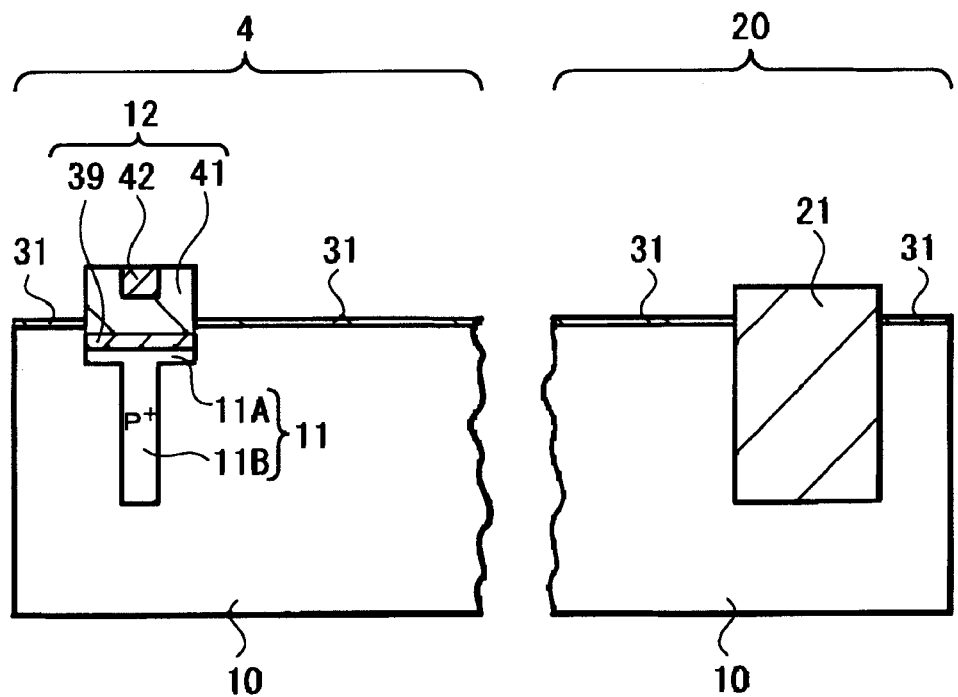
FIGS. 9A and 9B are process diagrams showing a method of manufacturing the solid-state imaging device of FIG. 3.

Accordingly, as shown in FIG. 9A, the element isolation layer (cover layer) 12 is formed in the pixel formation region 4 on the silicon substrate 10, including a convex-shaped insulation film (silicon oxide film 39, silicon oxide film 41 and silicon oxide film 42), and the element isolation region (channel stop diffusion layer) 11 is formed under the element isolation layer (cover layer) 12.

On the other hand, the element isolation layer 21 is formed as the STI in the peripheral circuit formation region 20 of the same silicon substrate 10.

Figure 9B:
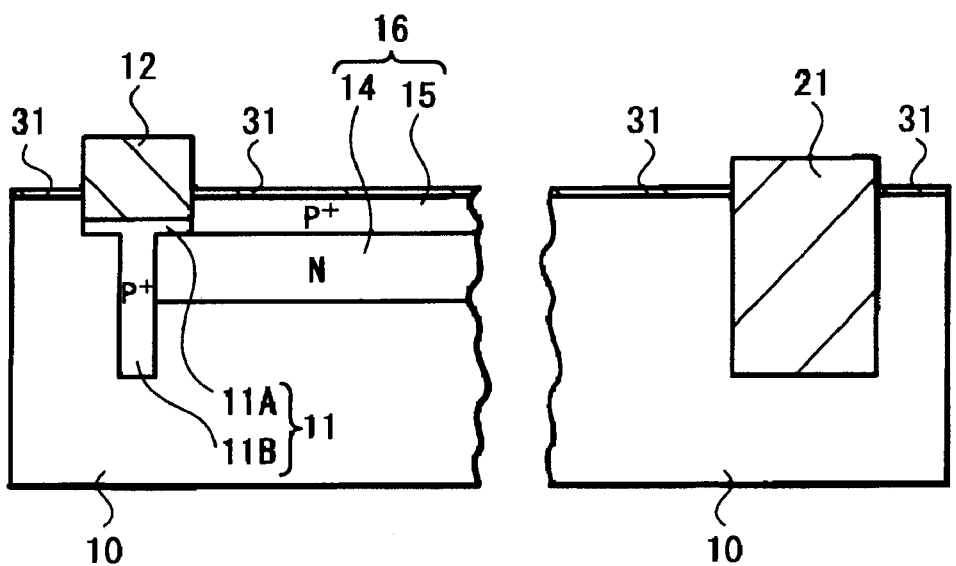

Thereafter, as shown in FIG. 9B, an N-type charge accumulation region 14 and a positive charge accumulation region 15 of a sensor portion 16, source/drain regions of a transistor, and the like are sequentially formed by ion implantation into the silicon substrate.

Then, after a gate electrode and the like are formed on the silicon oxide film 31 on the surface of the semiconductor substrate 10, a color filter, an on-chip lens and the like are formed in the pixel formation region 4 as need arises to manufacture a solid-state imaging device.

According to the above-described manufacturing method, by adding a minimum necessary process to an STI formation process in related art, the element isolation layer 21 can be formed as the STI in the peripheral circuit formation region 20, and the element isolation layer (cover layer) 12 and the element isolation region 11 of the junction separation can be formed in the pixel formation region 4.

According to the above-described solid-state imaging device of this embodiment, since the N-type charge accumulation region 14 of the sensor portion 16 is formed extending to a position under the element isolation layer (cover layer) 12, the sensor portion 16 that is the photoelectric conversion element extends to a position under the element isolation layer (cover layer) 12 and saturation charge quantity can be obtained to the maximum.

Accordingly, the characteristics such as the resolution of the solid-state imaging device can be improved.

Further, in the pixel formation region 4, the element isolation portion includes the element isolation region 11 inside the semiconductor substrate 10 and the element isolation layer (cover layer) 12.

Accordingly, in comparison with a case where the element isolation portion of the STI structure is made, noise caused by a crystalline defect, a damage and an interfacial level around the element isolation portion can be reduced.

Furthermore, since the element isolation layer 21 of the STI structure is formed in the peripheral circuit formation region 20 similarly to the element isolation portion of the CMOS sensor in related art, higher-speed operation, reduction of power consumption and space saving of the peripheral circuit can be achieved simultaneously.

Figure 10:
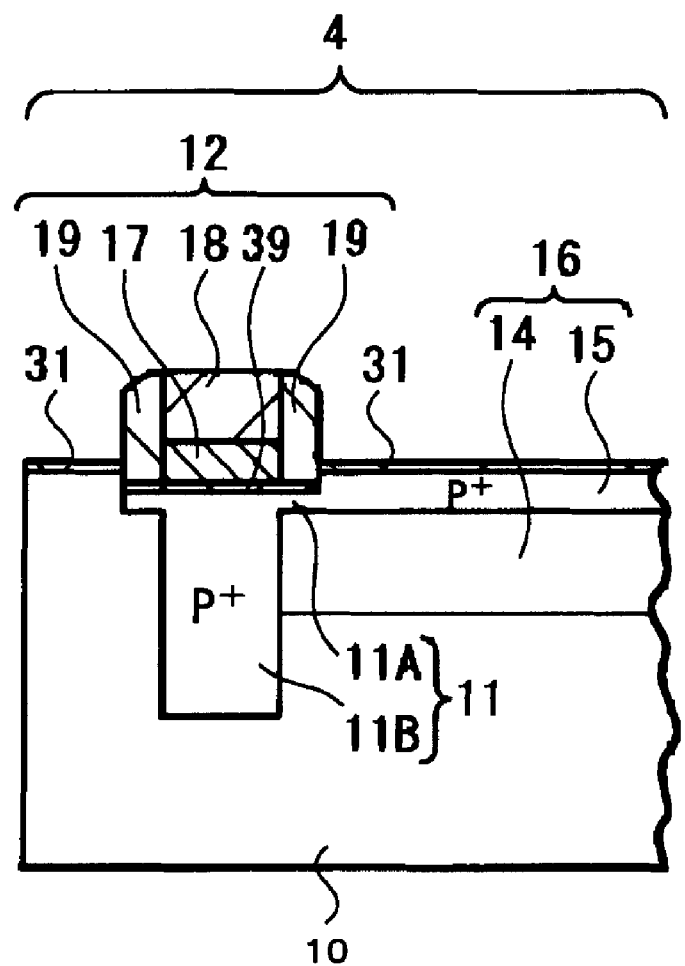
FIG. 10 is a schematic constitutional view (sectional view) of a solid-state imaging device according to another embodiment of the present invention.

FIG. 10 is a schematic constitutional diagram (sectional diagram) showing a solid-state imaging device according to another embodiment of the present invention.

In the solid-state imaging device of this embodiment, particularly as shown in FIG. 10, an element isolation layer (cover layer) 12 in an element isolation portion of a pixel formation region 4 includes a laminated film of a polycrystalline silicon layer 17 and a silicon oxide film 18, a sidewall insulation layer 19 formed on the sidewall of the laminated film, and a silicon oxide film 39 under the polycrystalline silicon layer 17. Although not shown in the drawing, a peripheral circuit separation region includes the element isolation portion formed of the STI similarly to the previous embodiment shown in FIG. 3.

In addition, a lower portion 11B of an element isolation region 11 in the element isolation portion of the pixel formation region 4 is formed to be self-aligned with the laminated film of the polycrystalline silicon layer 17 and the silicon oxide film 18, and is formed to have the same width as that of the laminated film.

Further, similarly to the solid-state imaging device of the previous embodiment, an N-type charge accumulation region 14 of a sensor portion 16 is formed extending to a position under the element isolation layer (cover layer) 12 and connecting to the lower portion 11B of the element isolation region 11.

Note that, since a structure of the pixel formation region 4 other than the above is similar to the previous embodiment shown in FIG. 3, the same reference numerals are given and the redundant explanation thereof will be omitted.

Since the element isolation layer (cover layer) 12 is formed using the laminated film of the polycrystalline silicon layer 17 and the silicon oxide film 18, an shield effect can be obtained by the polycrystalline silicon layer 17 that is a conductive layer. Since leakage current due to a parasitic MOS can further be restrained by this shield effect, the leakage current can be restrained in comparison with a case where the element isolation layer 12 is formed only of a silicon oxide film, even if the thickness of the element isolation layer 12 is made thin (for example, about 30 nm).

With respect to the element isolation layer (cover layer) 12 in the pixel formation region 4, it is desirable that the depth inside the a silicon substrate 10 is 50 nm or less and a thickness is within the range of 30 nm to 150 nm.

In addition, although the element isolation layer 12 is formed partly entering the semiconductor substrate 10 in FIG. 10, the structure may be made such that the element isolation layer 12 is formed only on the semiconductor substrate 10.

The solid-state imaging device according to this embodiment can be manufactured as follows, for example.

Note that the peripheral circuit formation region is not shown in the following manufacturing process diagram.

Figure 11A:
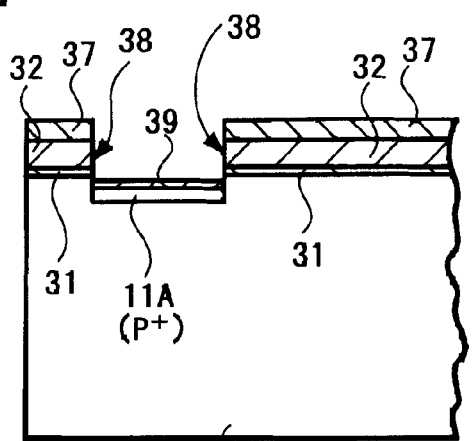
FIGS. 11A through 11C are process diagrams showing a method of manufacturing the solid-state imaging device of FIG. 10.

First, a state shown in FIG. 11A is obtained from a state of FIG. 7A of the previous embodiment through performing similar processes to those shown in FIGS. 7B and 7C.

Figure 11B:
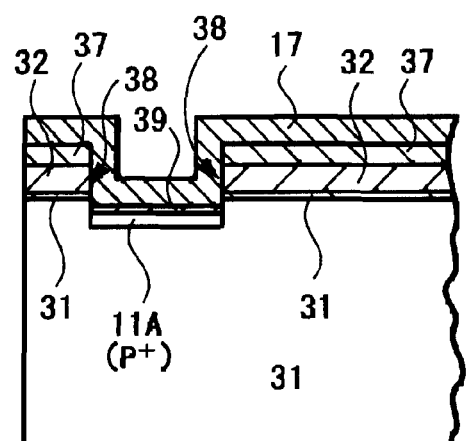

Next, as shown in FIG. 11B, the polycrystalline silicon layer 17 is formed, having the thickness of, for example 10 nm to 70 nm, that is, thinner than a laminated film of a silicon nitride film 32 and a silicon nitride film 37.

Hence, the polycrystalline silicon layer 17 is formed along the inner wall of an opening 38, and space remains in a central part of the opening 38.

Figure 11C:
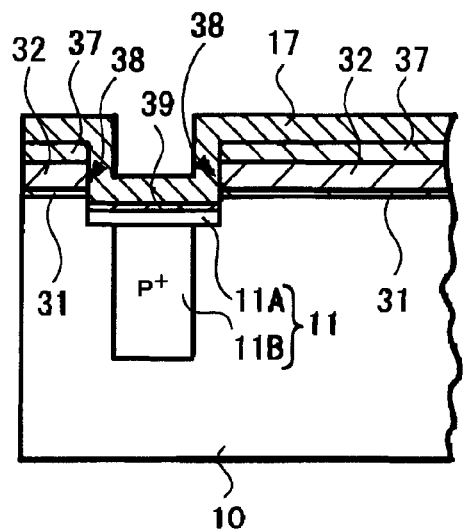

Next, as shown in FIG. 11C, the lower portion 11B of the element isolation region 11 is formed to be self-aligned with the polycrystalline silicon layer 17 by ion implantation of a P-type impurity such as boron, for example, in a concentration of $5 \times 10^{12}$ to $1 \times 10^{14}$ piece/cm$^2$ into the silicon substrate 10. Here, the polycrystalline silicon layer 17 in the opening 38 acts as a mask when performing the ion implantation, and the width of the lower portion 11B of the element isolation region 11 becomes a narrow width corresponding to the space in the central part of the opening 38. Accordingly, the lower portion 11B of the element isolation region 11 is formed to have a narrower width than an upper portion 11A, and the element isolation region 11 having a T-shaped section is formed.

Next, a silicon oxide film 18 is formed by the HDP method to have the thickness of 100 nm to 200 nm, for example. Accordingly, the space in the central part of the opening 38 is filled with the silicon oxide film 18.

Figure 12A:
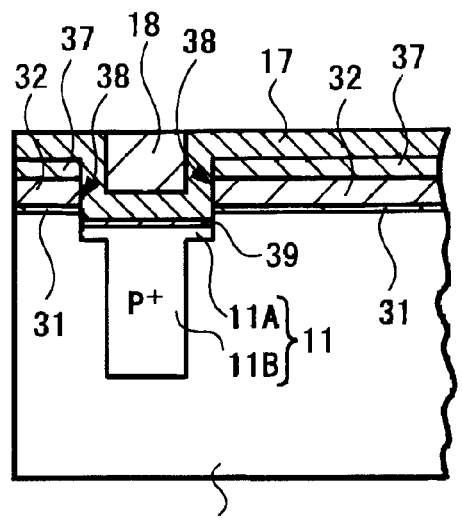
FIGS. 12A through 12C are process diagrams showing a method of manufacturing the solid-state imaging device of FIG. 10.

Subsequently, the silicon oxide film 18 on the polycrystalline silicon layer 17 is removed by planarizing the surface using the CMP method or the etch-back method. At this time, the polycrystalline silicon layer 17 acts as a stopper layer for the CMP or the etching. Accordingly, only the silicon oxide film 18 inside the opening 38 remains (so far refer to FIG. 12A).

Figure 12B:
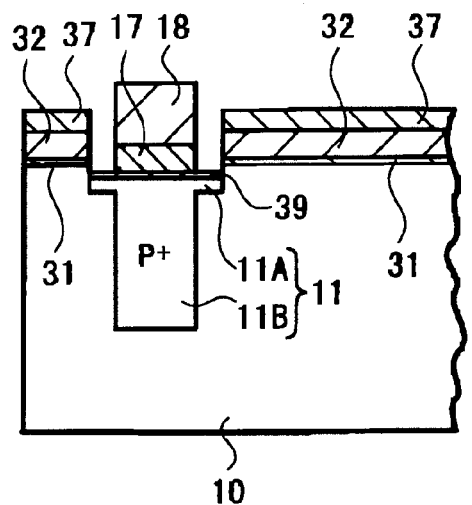

Next, as shown in FIG. 12B, an exposed portion of the polycrystalline silicon layer 17 is etched and removed by dry etching or by using fluoro-nitric acid liquid. Hence, the silicon oxide film 18 and the polycrystalline silicon layer 17 thereunder remain.

Next, though not shown in the drawing, a sidewall of the polycrystalline silicon layer 17 is oxidized in the thickness of approximately 10 nm to 20 nm.

Figure 12C:
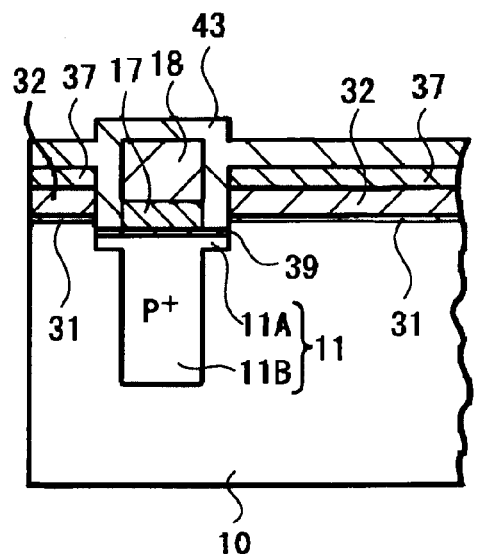

Subsequently, as shown in FIG. 12C, a silicon oxide film 43 is formed to have a thickness of 100 nm to 200 nm by the HDP.

Figure 13A:
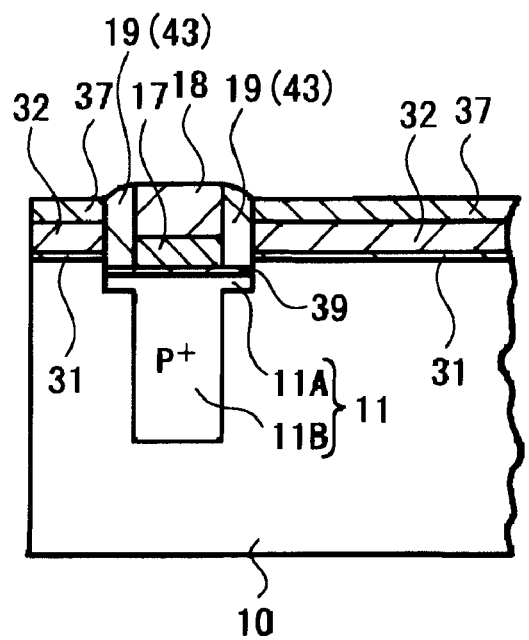
FIGS. 13A and 13B are process diagrams showing a method of manufacturing the solid-state imaging device of FIG. 10.

Next, as shown in FIG. 13A, the silicon oxide film 43 is planarized using the CMP method or the etch-back method and a sidewall insulation layer 19 made of the silicon oxide film 43 is formed on the sidewall of the laminated film of the polycrystalline silicon layer 17 and the silicon oxide film 18. At this time, the silicon nitride films 32 and 37 act as stopper layers for the CMP and the etching. Note that the silicon oxide film 18 becomes thinner than the state of FIG. 12C by the above process.

Subsequently, annealing is performed at a temperature of 600° C. to 1,000° C. to densify the silicon oxide films 18 and 19.

Next, the silicon nitride films 37 and 32 are removed by using the hot phosphoric acid liquid.

Figure 13B:
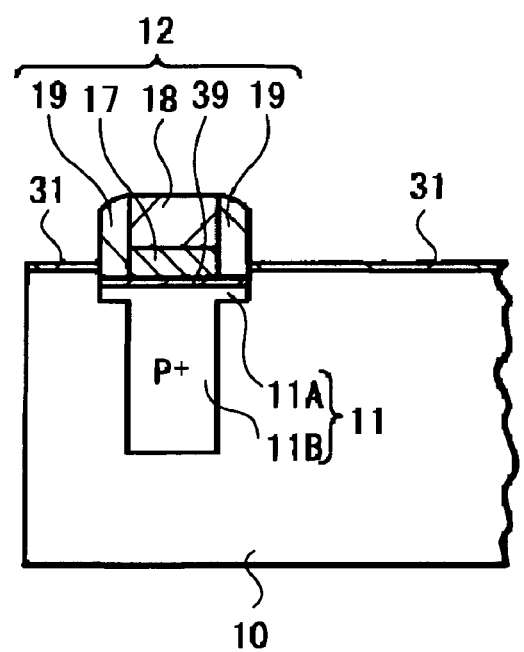

Accordingly, as shown in FIG. 13B, on the semiconductor substrate 10 the element isolation layer (cover layer) 12 is formed of the silicon oxide film 39, the polycrystalline silicon layer 17, the silicon oxide film 18 and the sidewall insulation layer 19, and the element isolation region (channel stop diffusion layer) 11 is formed under the element isolation layer (cover layer) 12.

On the other hand, an element isolation portion made of the STI is formed in the peripheral circuit formation region in the same silicon substrate 10.

After that, the N-type charge accumulation region 14 and the positive charge accumulation region 15 of the sensor portion 16, source/drain regions of a transistor, and the like are sequentially formed by ion implantation into the semiconductor substrate 10.

Then, after a gate electrode and the like are formed on a silicon oxide film 31 on the surface of the semiconductor substrate 10, a color filter, an on-chip lens, and the like are formed in the pixel formation region 4 as need arises to manufacture a solid-state imaging device.

According to the above-described embodiment, since the element isolation layer (cover layer) 12 is formed of the laminated film including the polycrystalline silicon layer 17 and the silicon oxide film 18 thereon, an influence of an electric field of the gate electrode formed on the element isolation layer 12 is shielded by the polycrystalline silicon layer 17 that is a conductive layer, and the leakage current can be restrained.

Accordingly, the thickness of the element isolation layer 12 can be made thin in comparison with a case where the element isolation layer 12 is formed only of an insulation layer such as a silicon oxide film.

Figure 14A:
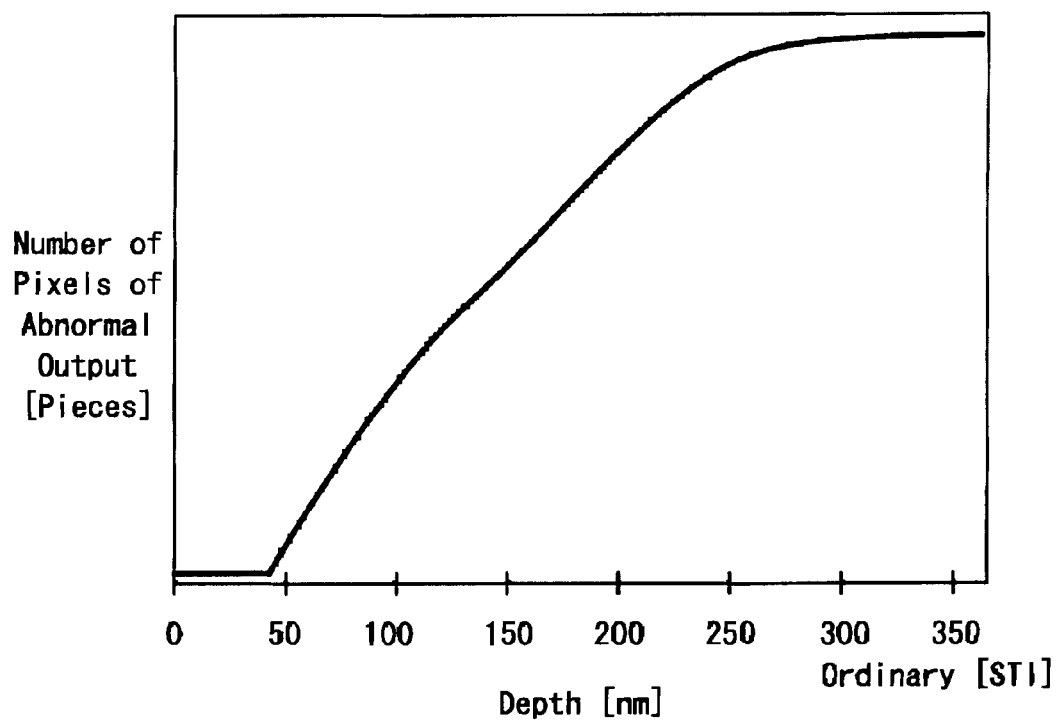
Figure 14B:
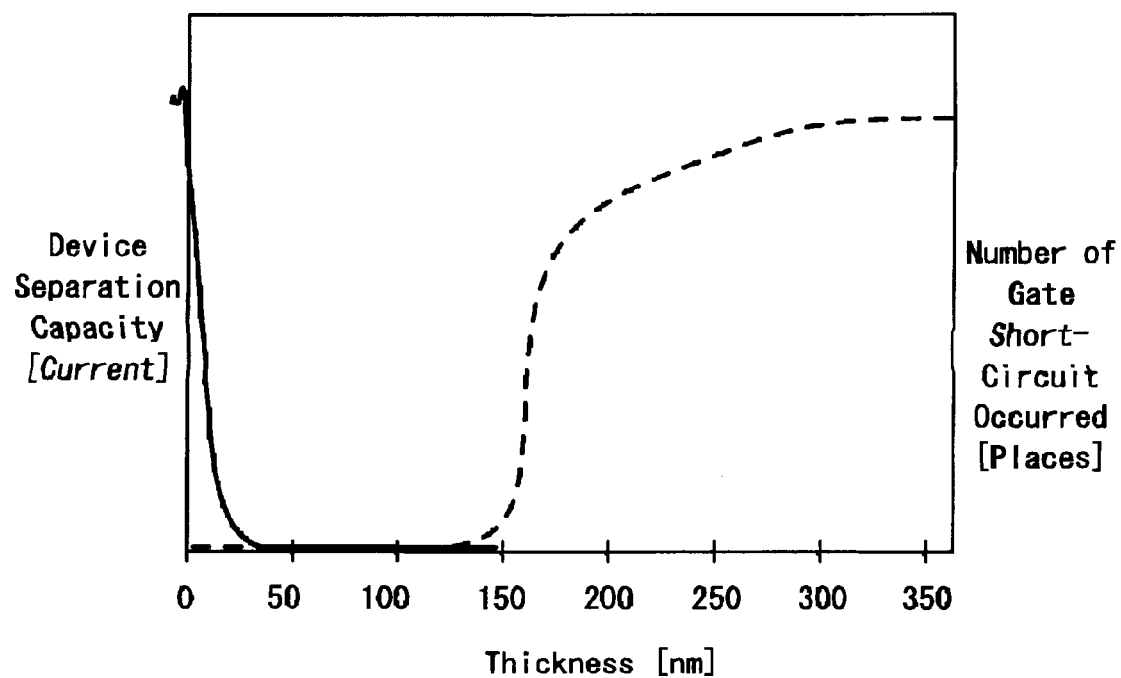

Here, FIG. 14A shows a relation between a depth (amount of digging into the silicon substrate 10) of the element isolation layer 12 (cover layer) formed inside the silicon substrate 10 in the pixel formation region 4 and the number of pixels in which an abnormal output (noise) is generated; and FIG. 14B shows a relation between a thickness of the element isolation layer 12 in the pixel formation region 4, and element isolation capacity (critical value of leakage current) and the number of occurrences of gate short-circuit, with respect to this embodiment shown in FIG. 10.

Similarly to FIG. 5A, the number of pixels in which an abnormal output is generated increases as shown in FIG. 14A when the depth exceeds 50 nm.

Further, similarly to FIG. 5B, the gate electrode tends to become short-circuited as shown in FIG. 14B when the thickness of the element isolation layer 12 exceeds 150 nm, and a yield ratio deteriorates considerably.

Furthermore, the thickness of the element isolation layer 12, in which the leakage current of the parasitic MOS transistor showing the element isolation capacity increases, decreases from less than 50 nm shown in FIG. 5B to less than 30 nm shown in FIG. 14B. Specifically, it is understood that when the element isolation layer 12 is provided with the conductive layer such as the polycrystalline silicon layer 17 or the like, the thickness of the element isolation layer 12 can be made thin, where the range thereof is made 30 nm or more.

Thus, the element isolation can be performed as long as the element isolation layer 12 has a minimum thickness of 30 nm, that is, the necessary performance can be secured even if the thickness of the element isolation layer is made thinner by approximately 20 nm.

In other words, since the element isolation layer 12 can be made thinner than a case where an element isolation layer 12 is formed only of an insulation film, a gate electrode formed on an upper layer can be processed easily.

In addition, according to the above-described another embodiment, saturation charge quantity can be made large because the N-type charge accumulation region 14 of the sensor portion 16 is formed extending to a position under the element isolation layer (cover layer) 12, similarly to the previous embodiment.

Accordingly, the characteristics such as the resolution of the solid-state imaging device can be improved.

The explanation is made with respect to the case where the semiconductor substrate 10 such as a silicon substrate is used as the semiconductor substrate in the above-described embodiments, however other than those, a semiconductor substrate may be configured to include a semiconductor substrate and a semiconductor epitaxial layer thereon, for example.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a solid-state imaging device in which a pixel formation region including a pixel made of a photoelectric conversion element and a selection transistor to read out a signal charge from said photoelectric conversion element and a peripheral circuit formation region are formed in the same semiconductor substrate, comprising the steps of:

forming a stopper layer on said semiconductor substrate;

forming a trench reaching from said stopper layer to the inside of said semiconductor substrate in a portion to become said peripheral circuit formation region;

burying and planarizing an insulation layer inside said trench;

forming an opening shallower than said trench from said stopper layer in a portion to become said pixel formation region; and burying and planarizing an insulation layer inside said opening.

2. A method of manufacturing a solid-state imaging device according to claim 1, further comprising the step of:

burying and planarizing a conductive layer and an insulation layer inside said opening after forming said opening.

* * * * *